United States Patent
Su et al.

(10) Patent No.: US 11,189,793 B2
(45) Date of Patent: Nov. 30, 2021

(54) METHOD OF FORMING RESISTIVE RANDOM ACCESS MEMORY CELL

(71) Applicant: UNITED MICROELECTRONICS CORP., Hsin-Chu (TW)

(72) Inventors: Shih-Wei Su, Tainan (TW); Da-Jun Lin, Kaohsiung (TW); Bin-Siang Tsai, Changhua County (TW); Ya-Jyuan Hung, Kaohsiung (TW); Ting-An Chien, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 161 days.

(21) Appl. No.: 16/589,148

(22) Filed: Oct. 1, 2019

(65) Prior Publication Data

US 2021/0074917 A1 Mar. 11, 2021

(30) Foreign Application Priority Data

Sep. 9, 2019 (TW) ................... 108132415

(51) Int. Cl.
*H01L 45/00* (2006.01)
*H01L 27/24* (2006.01)
(52) U.S. Cl.
CPC ............ *H01L 45/165* (2013.01); *H01L 27/24* (2013.01); *H01L 45/1253* (2013.01); *H01L 45/145* (2013.01); *H01L 45/1675* (2013.01)
(58) Field of Classification Search
None
See application file for complete search history.

(56) References Cited

U.S. PATENT DOCUMENTS

| | | | |
|---|---|---|---|
| 4,683,637 A * | 8/1987 | Varker | H01L 21/76264 438/294 |
| 6,507,061 B1 | 1/2003 | Hudgens | |
| 6,972,429 B1 * | 12/2005 | Hsueh | H01L 45/06 257/3 |
| 7,531,825 B2 | 5/2009 | Lai | |
| 8,420,478 B2 | 4/2013 | Chiang | |
| 8,809,159 B2 | 8/2014 | Wang | |
| 9,025,360 B2 | 5/2015 | Pramanik | |
| 9,036,400 B2 | 5/2015 | Lu | |
| 9,246,084 B2 | 1/2016 | Lin | |
| 9,799,705 B1 | 10/2017 | Yi | |
| 9,806,255 B1 | 10/2017 | Hsu | |
| 9,859,335 B1 | 1/2018 | Hsu | |
| 10,153,432 B2 | 12/2018 | Zhu | |
| 2006/0131618 A1 * | 6/2006 | Hsueh | H01L 21/425 257/246 |

(Continued)

FOREIGN PATENT DOCUMENTS

KR 10-2012-0004826 A 1/2012

*Primary Examiner* — Erik T. K. Peterson
(74) *Attorney, Agent, or Firm* — Winston Hsu

(57) ABSTRACT

A method of forming a resistive random access memory cell includes the following steps. A first electrode layer, a blanket resistive switching material layer and a second electrode layer are formed on a layer sequentially. The second electrode layer is patterned to form a second electrode. The blanket resistive switching material layer is patterned to form a resistive switching material layer. An oxygen implanting process is performed to implant oxygen in two sidewall parts of the resistive switching material layer.

18 Claims, 4 Drawing Sheets

(56) References Cited

U.S. PATENT DOCUMENTS

| | | | | |
|---|---|---|---|---|
| 2007/0117361 A1* | 5/2007 | Nakai | ............... | H01L 21/76243 |
| | | | | 438/514 |
| 2009/0114898 A1* | 5/2009 | Ricker | ................ | H01L 45/1683 |
| | | | | 257/3 |
| 2009/0272961 A1* | 11/2009 | Miller | ................ | H01L 45/1641 |
| | | | | 257/4 |
| 2010/0163819 A1 | 7/2010 | Hwang | | |
| 2011/0303890 A1* | 12/2011 | Pickett | ................ | H01L 27/2472 |
| | | | | 257/5 |
| 2012/0202334 A1* | 8/2012 | Kochergin | ............ | H01L 45/141 |
| | | | | 438/382 |
| 2012/0223048 A1* | 9/2012 | Paranjpe | ............... | C23C 14/505 |
| | | | | 216/22 |
| 2013/0082232 A1* | 4/2013 | Wu | ..................... | H01L 27/2481 |
| | | | | 257/5 |
| 2013/0193394 A1* | 8/2013 | Lengade | ............... | H01L 45/146 |
| | | | | 257/4 |
| 2014/0301127 A1* | 10/2014 | Kim | .................... | H01L 27/2463 |
| | | | | 365/148 |
| 2015/0090583 A1* | 4/2015 | Kodaira | ............ | H01L 21/68764 |
| | | | | 204/192.34 |
| 2015/0357566 A1* | 12/2015 | Wang | .................. | H01L 45/1253 |
| | | | | 257/4 |
| 2016/0308127 A1* | 10/2016 | Kim | ....................... | H01L 45/165 |
| 2017/0186813 A1* | 6/2017 | Kim | ........................ | H01L 45/04 |
| 2019/0157553 A1* | 5/2019 | Trinh | .................. | H01L 45/1616 |
| 2019/0334085 A1* | 10/2019 | Charpin-Nicolle | ......................... H01L 45/1246 | |
| 2020/0126791 A1* | 4/2020 | Rizzolo | ............... | H01L 21/0332 |

\* cited by examiner

METHOD OF FORMING RESISTIVE RANDOM ACCESS MEMORY CELL

BACKGROUND OF THE INVENTION

1. Field of the Invention

The present invention relates generally to a method of forming a resistive random access memory cell, and more specifically to a method of forming a resistive random access memory cell using oxygen implants.

2. Description of the Prior Art

Memory is divided into two categories: volatile memory and non-volatile memory. In nowadays, the two important types of volatile memory are static random access memory (SRAM) and dynamic random access memory (DRAM). There are many types of non-volatile memory. Flash memory is the most popular type, and other types may include silicon-oxide-nitride-oxide-silicon (SONOS), ferro-electric random access memory (FRAM), phase-change random access memory (PRAM), magnetoresistive access memory (MRAM) and resistive random access memory (RRAM).

In semiconductor processes, a resistive random-access memory is composed of two upper and lower metal electrodes and a transition metal oxide (TMO). The operating theory is to use the variable resistance of the transition metal oxide. The applied bias voltage changes to induce different resistance values, and the internal stored value is determined by the internal resistance.

SUMMARY OF THE INVENTION

The present invention provides a method of forming a resistive random access memory cell, which implants oxygen into a resistive switching material layer, to restrain resistive switching parts of the resistive switching material layer, thereby enhancing data storage performance and saving power.

The present invention provides a method of forming a resistive random access memory cell including the following steps. A first electrode layer, a blanket resistive switching material layer and a second electrode layer are sequentially formed on a layer. The second electrode layer is patterned to form a second electrode. The blanket resistive switching material layer is patterned to form a resistive switching material layer. An oxygen implanting process is performed to implant oxygen in two sidewall parts of the resistive switching material layer.

According to the above, the present invention provides a method of forming a resistive random access memory cell, which sequentially forms a first electrode layer, a blanket resistive switching material layer and a second electrode layer on a layer; patterns the second electrode layer to form a second electrode; patterns the blanket resistive switching material layer to form a resistive switching material layer; and performs an oxygen implanting process to implant oxygen in two sidewall parts of the resistive switching material layer. By doing this, oxygen vacancies in the resistive switching material layer can be reduced, to restrain a resistive switching part of the resistive switching material layer and shrink the volume of the resistive switching part. This reduces set current of the device and thus saves power, and enhances the data storage ability.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
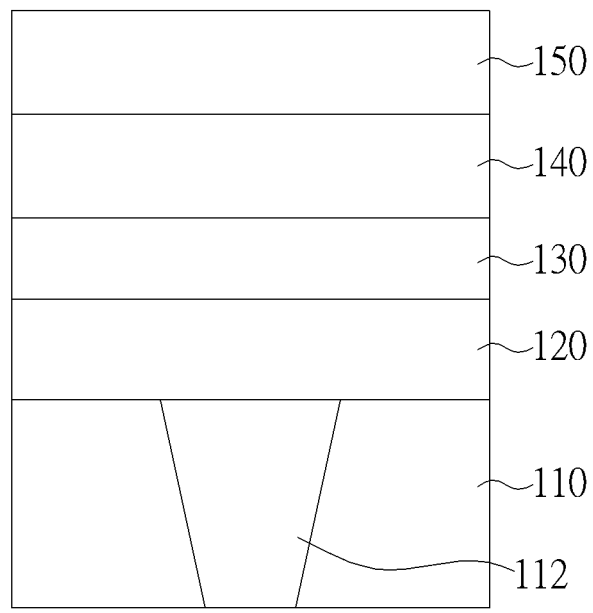
FIG. 1 schematically depicts a cross-sectional view of a method of forming a resistive random access memory cell according to an embodiment of the present invention.

FIGS. 1-7 schematically depict cross-sectional views of a method of forming a resistive random access memory cell according to an embodiment of the present invention. As shown in FIG. 1, a layer 110 is formed on a substrate (not shown), wherein the layer 110 may be a dielectric layer. The layer 110 may be an inter-metal dielectric layer, which may be an oxide layer. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate, but it is not limited thereto. In this embodiment, the layer 110 is only depicted in a resistive random access memory area, and resistive random access memory cells are in the resistive random access memory area, but it is not limited thereto. The layer 110 may be formed in other areas such as logic areas and alignment mark areas. A first metal interconnect 112 is formed in the layer 110 for connecting an above resistive random access memory cell. The first metal interconnect 112 may be metals such as copper. The first metal interconnect 112 may be metal lines or metal plugs etc. In one case, the first metal interconnect 112 may include a barrier layer (not shown) surrounding a metal, wherein the barrier layer may be a tantalum nitride layer, but it is not limited thereto.

A first electrode layer 120, a blanket resistive switching material layer 130, a second electrode layer 140 and a hard mask 150 are sequentially formed on the layer 110. The first electrode layer 120 and the second electrode layer 140 may include titanium nitride, tantalum nitride, titanium, tantalum, copper, aluminum or etc; the blanket resistive switching material layer 130 may include at least a transition metal oxide layer, and the blanket resistive switching material layer 130 may be a stacked insulating layer; the hard mask 150 may be an oxide layer, a nitride layer or the combinations of both, but it is not limited thereto. In this embodiment, the blanket resistive switching material layer 130 may be a tantalum oxide (TaO$_x$) layer, but it is not limited thereto. In one case, the blanket resistive switching material layer 130 may be a tantalum oxide (TaO$_x$) layer, a tantalum oxide (Ta$_2$O$_5$) layer, and an iridium (Ir) layer stacked from bottom to top. In other cases, the blanket resistive switching material layer 130 may be a single layer or a multilayer, which may include hafnium oxide (HfO$_2$), hafnium silicon oxide (HfSiO$_4$), hafnium silicon oxynitride (HfSiON), aluminum oxide (Al$_2$O$_3$), lanthanum oxide (La$_2$O$_3$), tantalum oxide (Ta$_2$O$_5$), yttrium oxide (Y$_2$O$_3$), zirconium oxide (ZrO$_2$), strontium titanate oxide (SrTiO$_3$), zirconium silicon oxide (ZrSiO$_4$), hafnium zirconium oxide (HfZrO$_4$), strontium bismuth tantalite (SrBi$_2$Ta$_2$O$_9$, SBT), lead zirconate titanate (PbZr$_x$Ti$_{1-x}$O$_3$, PZT) and barium strontium titanate (Ba$_x$Sr$_{1-x}$TiO$_3$, BST).

Figure 2:
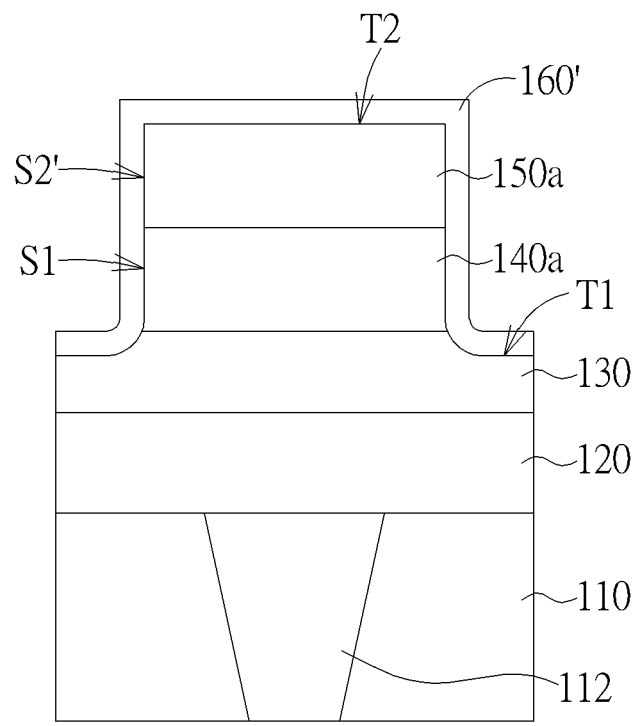
FIG. 2 schematically depicts a cross-sectional view of a method of forming a resistive random access memory cell according to an embodiment of the present invention.

The second electrode layer 140 may be patterned by methods such as an non-isotropic etching process to form a second electrode 140a, as shown in FIG. 2. More precisely, the hard mask 150 and the second electrode layer 140 are patterned to form the second electrode 140a and a hard mask 150a stacked from bottom to top.

Figure 3:
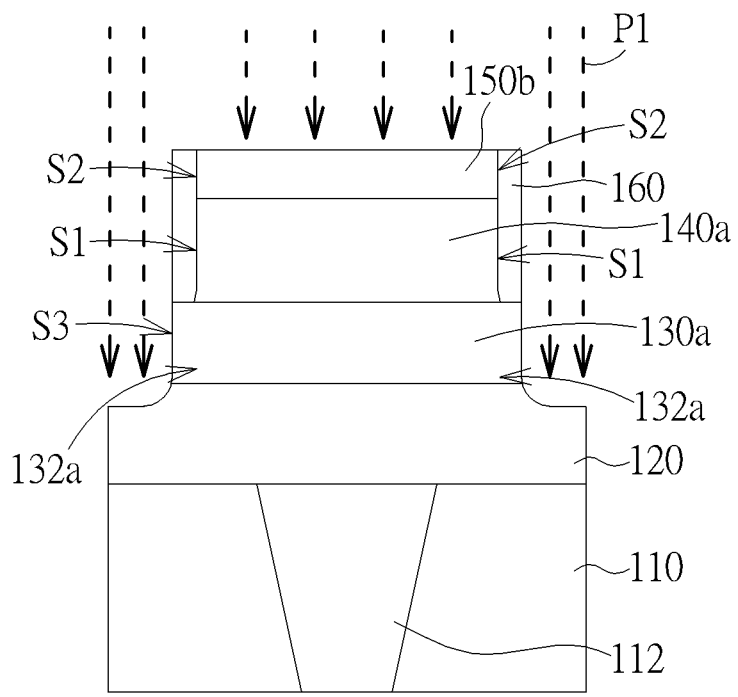
FIG. 3 schematically depicts a cross-sectional view of a method of forming a resistive random access memory cell according to an embodiment of the present invention.

Then, as shown in FIGS. 2-3, caps 160 are formed on sidewalls S1 of the second electrode 140a and sidewalls S2 of a hard mask 150b but expose two sidewall parts 132a of a resistive switching material layer 130a. The caps 160 may include silicon nitride, titanium nitride or amorphous carbon, but it is not limited thereto. As shown in FIG. 2, a cap layer 160' may conformally cover atop surface T1 of the blanket resistive switching material layer 130, the sidewalls S1 of the second electrode 140a and a top surface T2 and sidewalls S2' of the hard mask 150a. As shown in FIG. 3, the cap layer 160' is patterned by methods such as etching processes to form the caps 160 only on the sidewalls S1 of the second electrode 140a and the sidewalls S2 of the hard mask 150b. In this embodiment, the blanket resistive switching material layer 130 is etched while the cap layer 160' is patterned to form the resistive switching material layer 130a. Thereby, external sides of the caps 160 are trimmed with external sides of two sidewall parts 132a of the resistive switching material layer 130a. Moreover, the cap layer 160' on the top surface T2 of the hard mask 150a is removed completely, while the cap layer 160' is patterned, to expose the hard mask 150a and consume parts of the hard mask 150a to form the hard mask 150b. In other embodiments, the cap layer 160' is patterned and the blanket resistive switching material layer 130 is etched respectively by different etching processes. In a preferred embodiment, the cap layer 160' is patterned and the blanket resistive switching material layer 130 is etched by a first ion beam etching process P1. In a still preferred embodiment, the first ion beam etching process P1 is a vertical etching process to form vertical sidewalls S1/S2/S3. In other embodiment, the first ion beam etching process P1 is an oblique angle etching process, depending upon practical requirements.

Figure 4:
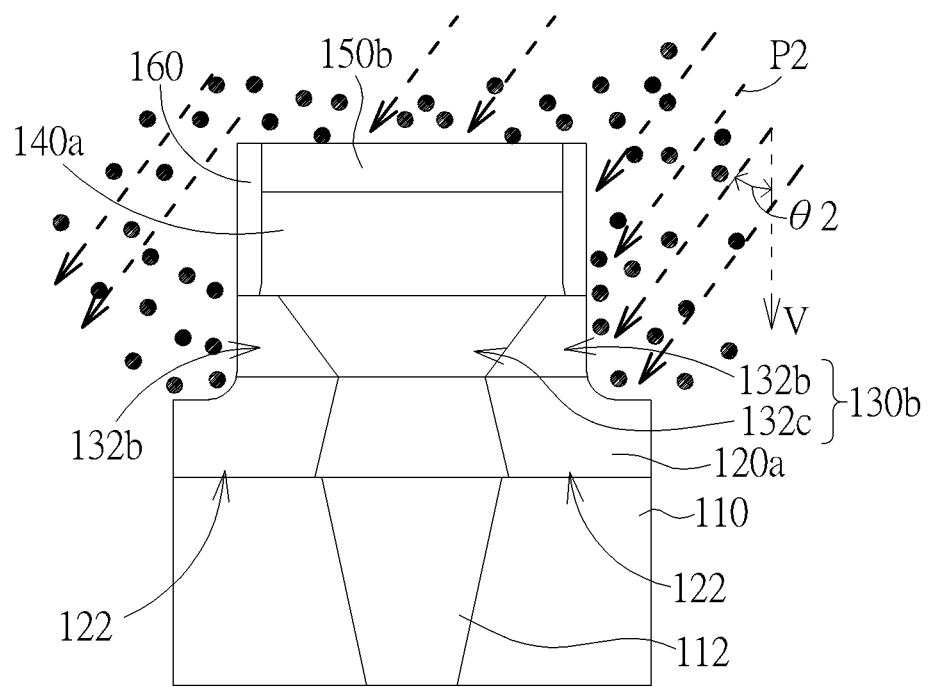
FIG. 4 schematically depicts a cross-sectional view of a method of forming a resistive random access memory cell according to an embodiment of the present invention.

As shown in FIGS. 3-4, an oxygen implanting process P2 is performed to implant oxygen on the two sidewall parts 132a of the resistive switching material layer 130a, thereby a doped resistive switching material layer 130b being formed, wherein the doped resistive switching material layer 130b includes two sidewall parts 132b. The doped resistive switching material layer 130b has an oxygen vacancy part 132c having a trapezoid-shaped cross-sectional distribution. Preferably, the oxygen vacancy part 132c having the trapezoid-shaped cross-sectional distribution is an oxygen vacancy part having an inverted trapezoid-shaped cross-sectional distribution, so that the doped resistive switching material layer 130b can be formed by oblique doping of the oxygen implanting process P2 easily. In other words, the oxygen implanting process P2 is performed to implant oxygen in the two sidewall parts 132a of the resistive switching material layer 130a. That is, the oxygen vacancies of the two sidewall parts 132a are filled with oxygen atoms. In this embodiment, the two sidewall parts 132b have trapezoid-shaped cross-sectional profiles. In other embodiments, the two sidewall parts 132b have triangle-shaped cross-sectional profiles, depending upon practical requirements.

Preferably, the oxygen implanting process P2 is an oblique angle implanting process to form the doped resistive switching material layer 130b, wherein the doped resistive switching material layer 130b has the oxygen vacancy part 132c having the trapezoid-shaped cross-sectional distribution. Still preferably, the oxygen implanting process P2 is an oxygen sputtering process to fill oxygen atoms into oxygen vacancies of the two sidewall parts 132a, but it is not limited thereto. In one case, an exposed part of the first electrode layer 120 is also oxygen implanted while the oxygen implanting process P2 is performed, thereby a first electrode layer 120a having oxidized parts 122 being formed.

Figure 5:
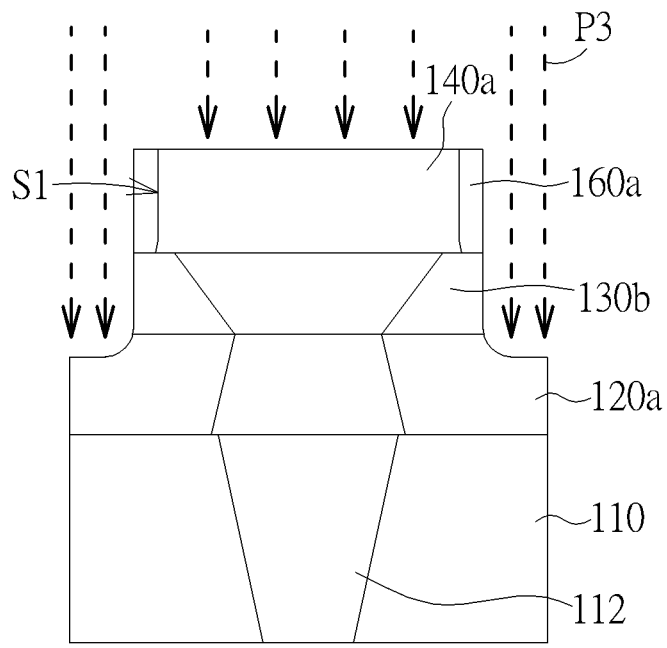
FIG. 5 schematically depicts a cross-sectional view of a method of forming a resistive random access memory cell according to an embodiment of the present invention.

Thereafter, the hard mask 150b is removed, as shown in FIG. 5. Preferably, the hard mask 150b is removed by a second ion beam etching process P3. Still preferably, the second ion beam etching process P3 is a vertical etching process to remove the hard mask 150b without etching the doped resistive switching material layer 130b. In this embodiment, the caps 160 of FIG. 3 on the sidewalls S2 of the hard mask 150b are also removed while the hard mask 150b is removed, to form caps 160a only on the sidewalls S1 of the second electrode 140a.

Figure 6:
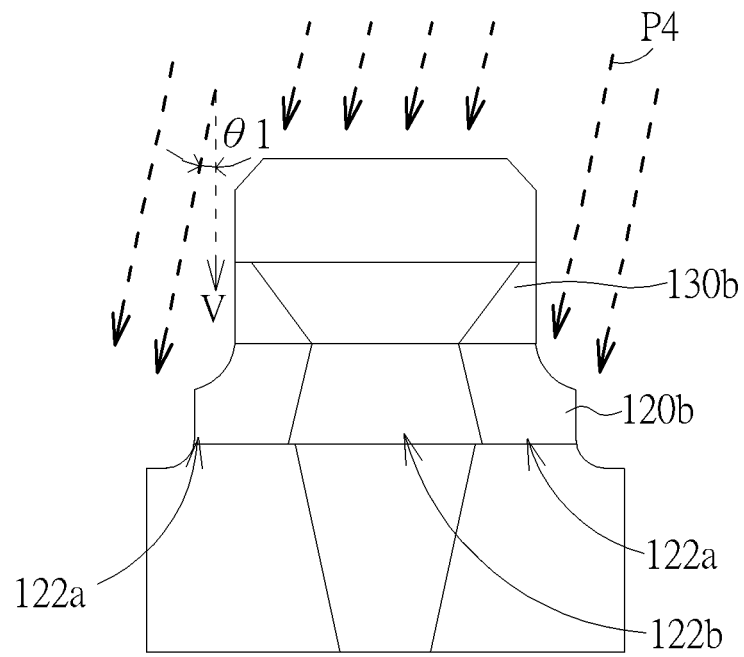
FIG. 6 schematically depicts a cross-sectional view of a method of forming a resistive random access memory cell according to an embodiment of the present invention.

The first electrode layer 120a is patterned to form a first electrode 120b, as shown in FIG. 6. The first electrode 120b reserves parts of the oxidized parts 122a and an non-oxidized part 122b between the oxidized parts 122a. The non-oxidized part 122b has a trapezoid-shaped cross-sectional profile. Preferably, the first electrode layer 120a is patterned by a third ion beam etching process P4. Still preferably, the third ion beam etching process P4 is an oblique angle etching process to form a first electrode 120b as well as remove the caps 160a. Still preferably, an etching angle θ1 of the third ion beam etching process P4 deflecting from a vertical direction V is less than an implant angle θ2 (as shown in FIG. 4) of the oxygen implanting process P2 deflecting from the vertical direction V, to remove the caps 160a without etching the doped resistive switching material layer 130b.

Figure 7:
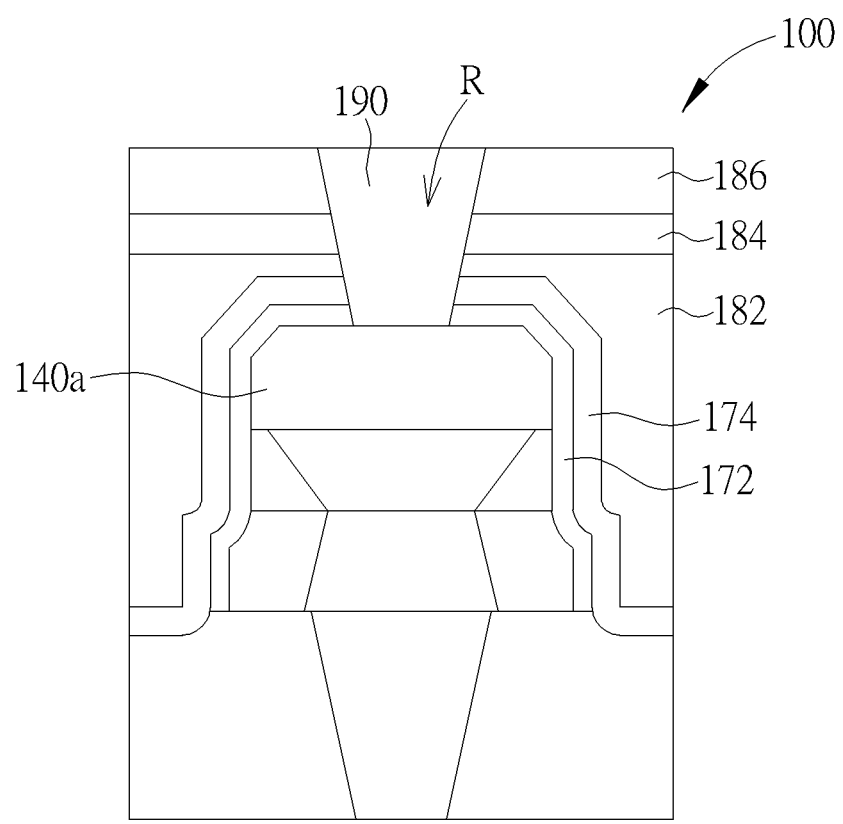
FIG. 7 schematically depicts a cross-sectional view of a method of forming a resistive random access memory cell according to an embodiment of the present invention.

As shown in FIG. 7, a cap layer 172 and a cap layer 174 are sequentially and conformally deposited, wherein the cap layer 172/174 may be an oxide layer or a nitride layer etc. a first dielectric layer (not shown), an etch stop layer (not shown) and a second dielectric layer (not shown) are deposited sequentially and blanketly and then patterned to form a first dielectric layer 182, an etch stop layer 184 and a second dielectric layer 186, and form a recess R to expose the second electrode 140a. A second metal interconnect 190 is filled into the recess R. The second metal interconnect 190 may be metals such as copper. The second metal interconnect 190 may be metal lines or metal plugs etc. In one case, the second metal interconnect 190 may include a barrier layer (not shown) surrounding a metal, wherein the barrier layer may be a tantalum nitride layer, but it is not limited thereto. In this way, a resistive random access memory cell 100 is formed.

To summarize, the present invention provides a method of forming a resistive random access memory cell, which sequentially forms a first electrode layer, a blanket resistive switching material layer and a second electrode layer on a layer; patterns the second electrode layer to form a second electrode; patterns the blanket resistive switching material layer to form a resistive switching material layer; and performs an oxygen implanting process to implant oxygen in two sidewall parts of the resistive switching material layer. By doing this, oxygen vacancy parts of the resistive switching material layer can be reduced, to restrain a resistive switching part of the resistive switching material layer and shrink the volume of the resistive switching part . This reduces set current of the device and thus saves power, and enhances the data storage ability.

Moreover, the oxygen implanting process is performed to implant oxygen in the two sidewall parts of the resistive switching material layer, so that oxygen atoms can fill into oxygen vacancies in the two sidewall parts of the resistive switching material layer, therefore a doped resistive switching material layer being formed, wherein an oxygen vacancy part of the doped resistive switching material layer has a trapezoid-shaped cross-sectional distribution. Preferably, the oxygen implanting process is an oblique angle implanting process, so that the two sidewall parts have triangle-shaped cross-sectional profiles or trapezoid-shaped cross-sectional profiles, and the doped resistive switching material layer has the oxygen vacancy part having an inverted trapezoid-shaped cross-sectional distribution.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a resistive random access memory cell, comprising:
   sequentially forming a first electrode layer, a blanket resistive switching material layer and a second electrode layer on a layer;
   patterning the second electrode layer to form a second electrode, wherein the steps of patterning the second electrode layer comprise:
   forming a hard mask layer on the second electrode layer; and
   patterning the hard mask layer and the second electrode layer to form the second electrode and a hard mask stacked from bottom to top;
   patterning the blanket resistive switching material layer to form a resistive switching material layer;
   performing an oxygen implanting process to implant oxygen in two sidewall parts of the resistive switching material layer; and
   forming caps on sidewalls of the second electrode and sidewalls of the hard mask before the oxygen implanting process is performed, but exposing the two sidewall parts of the resistive switching material layer.

2. The method of forming a resistive random access memory cell according to claim 1, wherein the two sidewall parts of the resistive switching material layer are oxygen implanted, so that a doped resistive switching material layer comprising an oxygen vacancy part having a trapezoid-shaped cross-sectional distribution being formed.

3. The method of forming a resistive random access memory cell according to claim 2, wherein the oxygen vacancy part having the trapezoid-shaped cross-sectional distribution comprises an oxygen vacancy part having an inverted trapezoid-shaped cross-sectional distribution.

4. The method of forming a resistive random access memory cell according to claim 1, wherein the two sidewall parts of the resistive switching material layer are oxygen implanted, so that oxygen vacancies in the two sidewall parts of the resistive switching material layer are filled with oxygen atoms.

5. The method of forming a resistive random access memory cell according to claim 1, wherein the oxygen implanting process is an oblique angle implanting process.

6. The method of forming a resistive random access memory cell according to claim 5, wherein the oxygen implanting process comprises an oxygen sputtering process.

7. The method of forming a resistive random access memory cell according to claim 1, wherein an exposed part of the first electrode layer is oxygen implanted while the oxygen implanting process is performed.

8. The method of forming a resistive random access memory cell according to claim 1, wherein the caps comprise silicon nitride, titanium nitride or amorphous carbon.

9. The method of forming a resistive random access memory cell according to claim 1, wherein the steps of forming the caps on the sidewalls of the second electrode and the sidewalls of the hard mask comprise:
   conformally covering a cap layer on a top surface of the blanket resistive switching material layer, the sidewalls of the second electrode, and the sidewalls and a top surface of the hard mask; and
   patterning the cap layer to form the caps only on the sidewalls of the second electrode and the sidewalls of the hard mask.

10. The method of forming a resistive random access memory cell according to claim 9, wherein the cap layer is patterned by a first ion beam etching process.

11. The method of forming a resistive random access memory cell according to claim 10, wherein the first ion beam etching process is a vertical etching process.

12. The method of forming a resistive random access memory cell according to claim 1, further comprising:
   removing the hard mask by a second ion beam etching process after the oxygen implanting process is performed.

13. The method of forming a resistive random access memory cell according to claim 12, wherein the second ion beam etching process is a vertical etching process.

14. The method of forming a resistive random access memory cell according to claim 1, further comprising:
   patterning the first electrode layer to form a first electrode after the oxygen implanting process is performed.

15. The method of forming a resistive random access memory cell according to claim 14, wherein the first electrode layer is patterned by a third ion beam etching process.

16. The method of forming a resistive random access memory cell according to claim 15, wherein the third ion beam etching process is an oblique angle etching process.

17. The method of forming a resistive random access memory cell according to claim 15, wherein an etching angle of the third ion beam etching process deflecting from a vertical direction is less than an implant angle of the oxygen implanting process deflecting from the vertical direction.

18. The method of forming a resistive random access memory cell according to claim 4, wherein the two sidewall parts have trapezoid-shaped cross-sectional profiles.

* * * * *